(12) United States Patent
Minuhin et al.

(10) Patent No.: US 6,314,444 B1
(45) Date of Patent: Nov. 6, 2001

(54) SECOND ORDER FILTER-DELAY ELEMENT FOR GENERALIZED ANALOG TRANSVERSAL EQUALIZER

(75) Inventors: Vadim B. Minuhin, Bloomington; Bernardo Rub, Edina, both of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/099,724

(22) Filed: Jun. 19, 1998

Related U.S. Application Data
(60) Provisional application No. 60/050,261, filed on Jun. 19, 1997.

(51) Int. Cl.$^7$ .................................................. G06G 7/02
(52) U.S. Cl. ............................................................ 708/819
(58) Field of Search .................... 708/819, 319, 708/322–323

(56) References Cited

U.S. PATENT DOCUMENTS

| | | | |
|---|---|---|---|
| 5,168,461 | * 12/1992 | Wu et al. ............................... | 708/819 |
| 5,325,322 | * 6/1994 | Bailey et al. ......................... | 708/819 |
| 5,422,760 | 6/1995 | Abbott et al. . | |
| 5,592,340 | 1/1997 | Minuhin et al. . | |
| 5,650,954 | 7/1997 | Minuhin . | |

OTHER PUBLICATIONS

D.S. Humpherys, "Equiripple Network Approximations Using Iteration Techniques," Proceedings of National Electronics Conference, pp. 753–758, (Jun. 19, 1964).

R.D. Cideciyan, Francois Dolivo, Reto Hermann, Walter Hirt, And Wolfgang Schott, "A PRML System for Digital Magnetic Recording," IEEE Journal on Selected Areas of Communications, vol. 10 (No. 1), pp. 38–56, (Jan. 19, 1992).

K. Parsi, N. Rao, R. Burns, A. Chaiken, M. Chambers, R. Cheug, B. Forni, D. Harnishfeger, C. Jam, S. Kaylor, M. Pennell, J. Perez, M. Rohrbaugh, M. Ross, G. Stuhlmiller, N. Weiner, "TP 4.3: A 200Mb/s PRML Read/Write Channel IC," 1996 IEEE International Solid–State Circuits Conference, pp. 66–67, (Feb. 8, 1996).

V. Minuhin And V. Kovner, "Adaptive, Analog, Continuous–Time Time–Domain Equalization for Sampled Channels in Digital Magnetic Recording," IEEE Transaction on Magnetics, vol. 33, (No. 5), pp. 2782–2784, (Sep. 19, 1997).

K. Parsi, R. Burns, A. Chaiken, M. Chambers, B. Forni, D. Harnishfeger, S. Kaylor, M. Pennell, J. Perez, N. Rao, M. Rohrbaugh, M. Ross, G. Stuhlmiller, "A PRML Read/Write Channel IC Using Analog Signal Processing for 200 Mb/s HDD," 1996 IEEE Journal of Solid–State Circuits, vol. 31 (No. 11), pp. 1817–1830, (Nov. 1996).

R. Alini, G. Betti, R. Castello, F. Heydari, G. Maguie, L. Fredrickson, L. Volz, D. Stone, "SA 19.3: A 200MSample/s Trellis–Coded PRML Read/Write Channel with Digital Servo," 1997 IEEE International Solid–State Circuits Conference, pp. 318–319 and 246–247, (Feb. 8, 1997).

* cited by examiner

*Primary Examiner*—Tan V. Mai
(74) *Attorney, Agent, or Firm*—Kirk A. Cesari

(57) ABSTRACT

A second order filter-delay element for use in a generalized analog transversal equalizer is described which provides phase and group delay responses equivalent to low-pass filters of third and fourth order. In addition, the filter-delay element provides sufficient values of delays required for proper operations of the analog generalized transversal equalizer despite having a low order. In addition, a method of generating the lower order filter-delay element is described. Also, a circuit embodying an active C-transconductor realization of a second order filter-delay element for use in a generalized analog transversal equalizer with a transfer function designed as a result of performing the method is described.

7 Claims, 11 Drawing Sheets

SECOND ORDER FILTER-DELAY ELEMENT FOR GENERALIZED ANALOG TRANSVERSAL EQUALIZER

RELATED INVENTION

This application claims the benefit of U.S. Provisional Application No. 60/050,261 entitled "Second Order Filter-Delay Element For Generalized Analog Transversal Equalizer" filed Jun. 19, 1997.

FIELD OF THE INVENTION

The present invention relates generally to improvement in electronic filters, and more particularly, but not by way of limitation, to improvement in electronic filters that are suitable in sampled communication channels such as in digital magnetic recording disk drive read channels.

BACKGROUND OF THE INVENTION

One type of signal processing typically associated with high-density magnetic recording channels is the time-domain equalization. Such equalization is used to reshape a readback signal received by the channel to an approximation of a desired target waveform in the time domain, such as used in a Partial Response, Maximum Likelihood (PRML) detection read channel (see the paper "A PRML System for Digital Magnetic Recording" by R. D. Cidecian et al., IEEE Journal on Selected Areas in Communication, vol.10, no.1 January 1992). As will be recognized, reshaping the readback signal allows intersymbol interference (ISI) to be reduced and controlled, facilitating reliable sequential decoding of the digital information stored on disk.

Basic instrument for time-domain equalization in magnetic recording channels is the transversal equalizer, be it in a digital implementation (see U.S. Pat. No. 5,422,760, issued Jun. 6, 1995, entitled "Disk Drive Method Using Zoned Data Recording and PRML Sampling Data Detection with Digital Adaptive Equalization" filed Aug. 17, 1994 by Abbott et al.) or in analog implementation. The analog transversal equalizer, in turn, can be implemented either in discrete-time version, on samplers or in a continuous-time version. A continuous-time implementation is described in U.S. Pat. No. 5,592,340, issued Jan. 7, 1997, entitled "Communication Channel with Adaptive Analog Transversal Equalizer" filed Sep. 21, 1994 by Minuhin et al.

Transversal equalizers may be Finite Impulse Response (FIR) filtering devices or Infinite Impulse Response (IIR) filtering devices like the ones described in the above-identified Minuhin et al. '340 patent. A recent paper by V. Minuhin et al. "Adaptive, Analog, Continuous-Time Time-Domain Equalization for Sampled Channels in Digital Magnetic Recording" IEEE Transactions on Magnetics, September 1997, shows that IIR filters outperforms FIR filters not only as a practical device, but also theoretically.

The Minuhin et al. paper refers to the particular equalizer described as a Generalized Transversal Equalizer (GTE), to distinguish it from well known analog transversal equalizers. A need exists for an improved filtering system for a communication channel, and particularly for magnetic recording channel by making it simpler and more economical in manufacturing; reduce its size and power dissipation.

The present invention provides a solution to this and other problems, and offers other advantages over the prior art.

SUMMARY OF THE INVENTION

The present invention relates to GTE equalizers which solve the above-mentioned problem by further reduction of complexity, size and cost of the most component-intense blocks of GTE equalizers. In particular, the analog filter-delay elements have been reduced to a second order of filter-delay design. Despite the low order of the filter-delay elements, sufficient values of delays required for proper operations of the GTE equalizer are provided. The filter-delay elements are realized in integral implementation as just one biquad (i.e., an active filter section with second order denominator and numerator) with only two transconductor elements and two small integrated capacitors per section. In contrast, prior art filters required higher order filter-delay elements having at least two biquads per section. For example, the above-identified Minuhin et al. '340 patent describes sixth order filter delay elements.

In accordance with one embodiment of the invention, a second order filter-delay element for use in a generalized analog transversal equalizer is described which provides phase and group delay responses equivalent to low-pass filters of third and fourth order. In addition, the filter-delay element provides sufficient values of delays required for proper operations of the analog generalized transversal equalizer despite having a low order.

In accordance with another embodiment of the invention, a method of generating the lower order filter-delay element is described. The method includes decomposing denominators of an original low-pass transfer function into two polynomial multiplicands. Subsequently, one polynomial multiplicand is moved from a denominator into a numerator. A sign of members with odd degree of complex frequencies is changed in the numerator. Then, coefficients of polynomial in the numerator are adjusted to achieve zeros of transformed transfer function that are mirror-reflected images relative to complex frequency axis of poles created by the moved polynomial multiplicand in the original low-pass transfer function. Finally, a lower order filter-delay element is generated based on the transformed transfer function.

Also, a circuit embodying an active C-transconductor realization of a second order filter-delay element for use in a generalized analog transversal equalizer with a transfer function designed as a result of performing the method is described. The circuit includes a biquad C-transconductor circuit with at least two excitation nodes and an input voltage buffer with two complimentary outputs. An adjustment mechanism is used to change a ratio of two signals provided by the two complimentary outputs at input excitation nodes of the C-transconductor circuit to obtain required coefficients of a numerator of a transfer function to realize desired zeros of the transformed transfer function.

These and various other features as well as advantages which characterize the present invention will be apparent upon reading of the following detailed description and review of the associated drawings.

DETAILED DESCRIPTION

Figure 1:
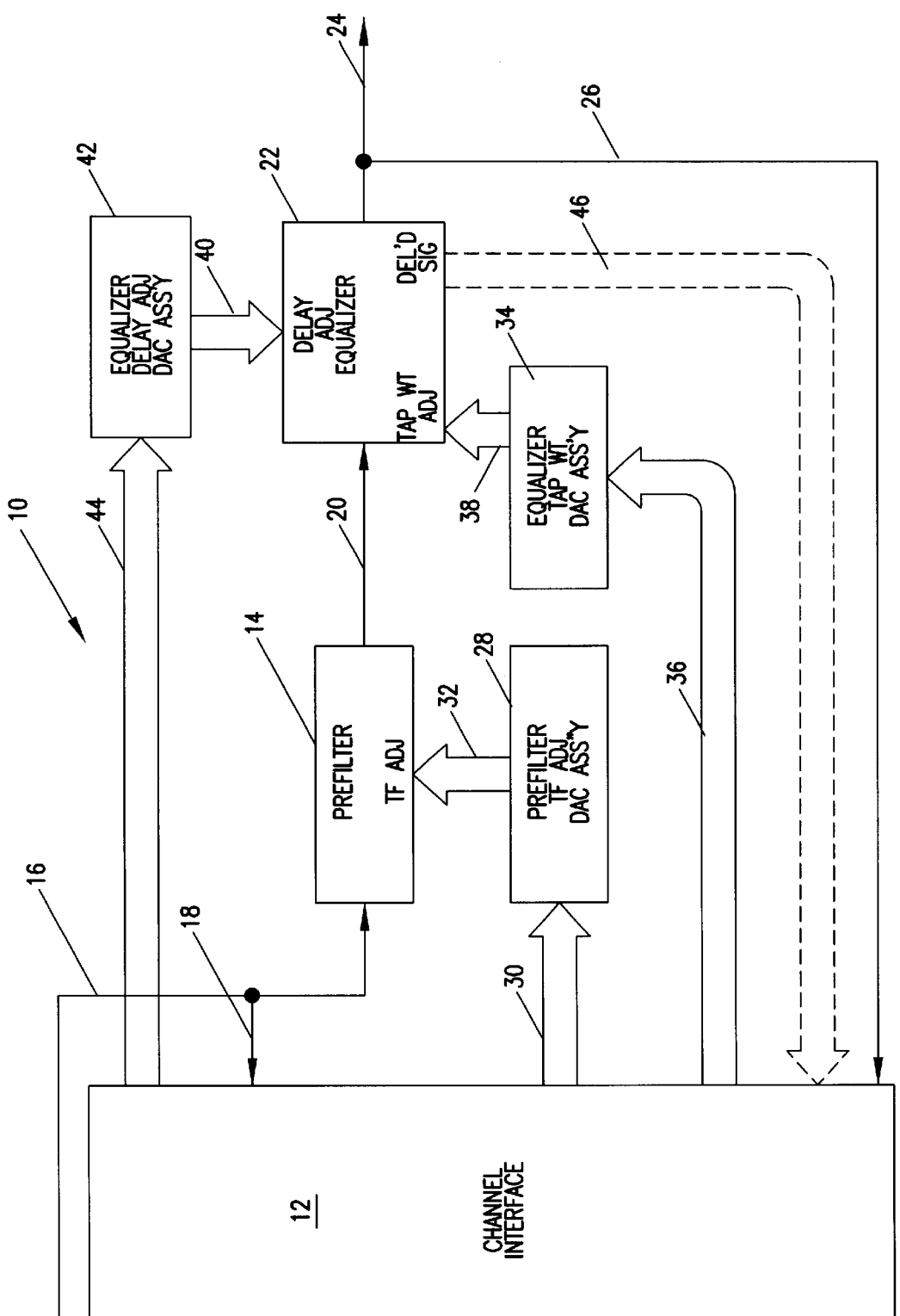
FIG. 1 is a block diagram of a prior art filtering system of a PRML-based digital magnetic recording readback channel that includes a GTE equalizer.

The prior art filtering system 10 which employs the a filter-delay element is shown in a block diagram of FIG. 1. It is contemplated that the filter system 10 will be formed on a single silicon chip, with other portions of a PRML read channel (not shown), and will have adaptive features that will be described below. It is further contemplated that, in the implementation of these features, the filter system 10 will receive digitally expressed, adaptive parameters from a microprocessor (not shown) via a chip interface 12 which is comprised of a plurality of latches (not shown) for storing the parameters.

Similarly, it is contemplated that the adaptation of the filter 10 will be carried out at the time that a disc drive employing the PRML read channel of which the filter system 10 is a part is manufactured and that such adaptation will include the measurement of signals at various locations on the filter system 10. Thus, the chip interface 12 will further include electrical connectors (not shown) to which external equipment can be connected for the measurement of these signals.

As shown in FIG. 1 the filter system 10 is generally comprised of an adaptive, analog prefilter 14 which receives the signal to be filtered on a signal path 16 from a variable gain amplifier (not shown) which is formed on the same chip as the filter system 10 and, like the filter system 10, is a portion of a PRML read channel for a disc drive. For purposes to be discussed below, the unfiltered signal on the signal path 16 is also provided to the chip interface 12, via a signal path 18, for transmittal to external equipment utilized in the adaptation of the filter system 10.

The output of the prefilter 14 is transmitted via a signal path 20 to the input of an analog, adaptive transversal equalizer 22 and the transversal equalizer 22 provides the filtered signal to samplers (not shown) which may be part of a timing and gain control circuit formed on the same chip via a signal path 24. The filtered signal is also transmitted to an electrical connector (not shown) in the chip interface 12 via a signal path 26 for a purpose to be described below.

As has been noted above, both the prefilter 14 and the transversal equalizer 22 are adaptive so that their filtering characteristics can be adjusted via adaptive parameters provided by a microprocessor. It is contemplated that these parameters will be expressed as analog signals at the prefilter 14 and transversal equalizer 22 and digital to analog converter (DAC) assemblies are provided to convert the binary expressions of these parameters, by means of which they are stored in the microprocessor and outputted to latches in the chip interface 12, to analog parameter signals for use by the prefilter 14 and transversal equalizer 22.

In particular, the filter system 10 is comprised of a prefilter transfer function adjustment DAC assembly 28 which includes a plurality of digital to analog converters that receive binarily expressed adaptive parameters from the chip interface 12 via a bus 30 and output analog adaptive parameter signals that express the parameters to the prefilter 14 on signal paths that have been collectively indicated as a bus 32 in FIG. 1. For the preferred embodiment of the prefilter 14 to be discussed below, the adaptive parameter signals outputted by the DAC assembly 28 are electrical currents having magnitudes determined by binary values received from channel interface 12. Similarly, digitally expressed tap weights are provided to a plurality of digital to analog converters (not shown) in an equalizer tap weight DAC assembly 34 on a bus 36 from the chip interface 12, converted to analog signals in the DAC assembly 34, and transmitted to the transversal equalizer 22 via a plurality of signal paths collectively indicated by an analog bus 38 in FIG. 1. The transversal equalizer 22 is comprised of a plurality of adaptive filter sections and analog signals used to adjust the characteristics of these filter sections are received by the transversal equalizer 22 on a plurality of signal paths collectively indicated as an analog bus 40 in FIG. 1 from an equalizer delay adjust DAC assembly 42. Digital expressions of these signals are provided to the DAC assembly 42 visa bus 44. The filter sections of the transversal equalizer 22 generate signals that are delayed in time with respect to signals these sections receive and these delayed signals can be transmitted to the chip interface 12 via a plurality of signal paths, collectively indicated as a bus 46 in FIG. 1, for measurement by off chip apparatus connected to the interface 12.

Figure 2:
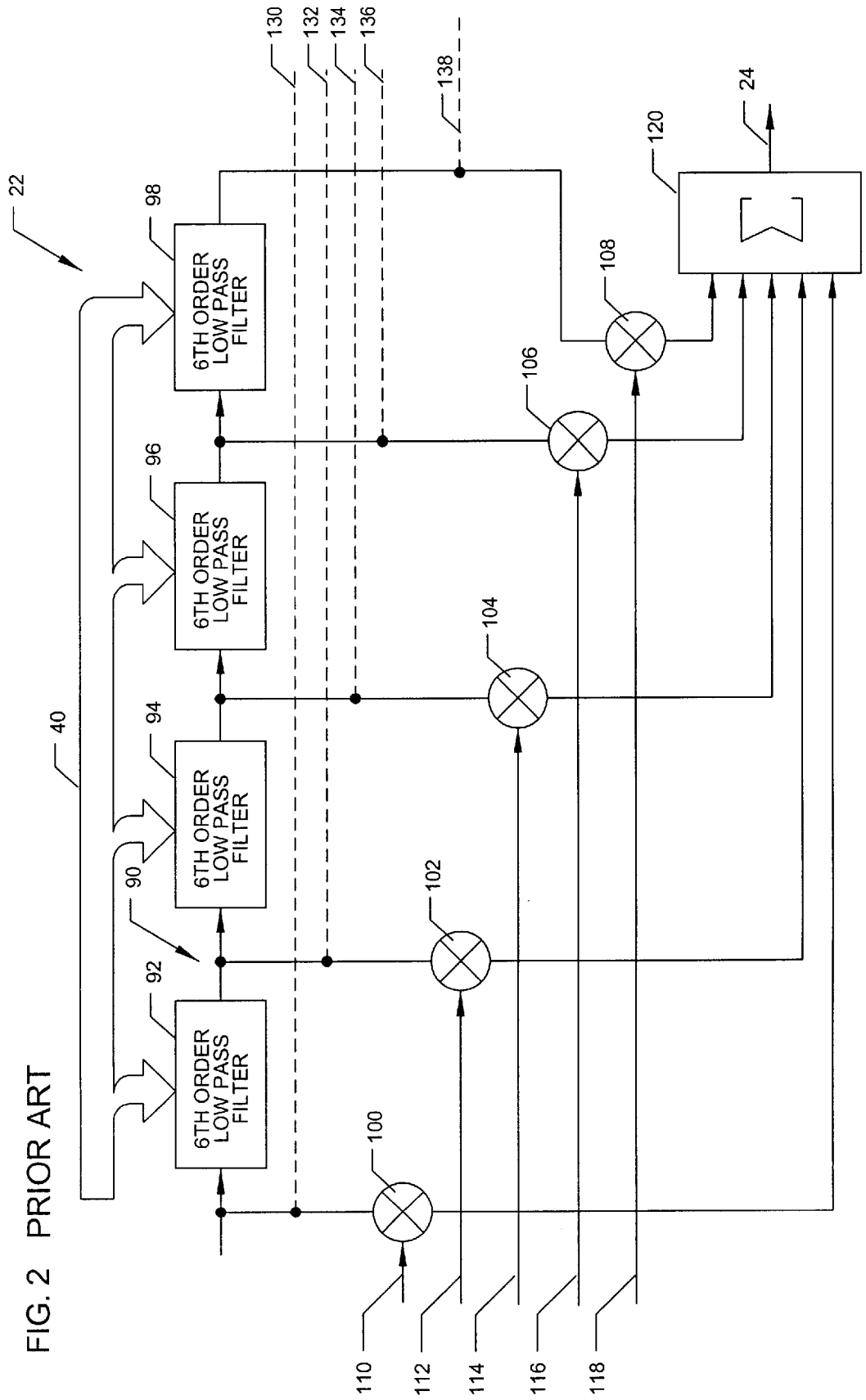
FIG. 2 is a block diagram of the prior art GTE equalizer of the filtering system shown in FIG. 1.

Referring to FIG. 2, the transversal equalizer 22 of the present invention is comprised of a delay circuit generally indicated at 90 that is comprised of a series of analog filter sections 92, 94, 96 and 98 that each provide a continuous response to a continuous excitation that, further, is delayed in time with respect to the excitation by an amount that depends upon the transfer function of each filter section. The delay circuit 90 is tapped at the input to the filter section 92, at the output of the filter section 98 and between each pair of filter sections 92, 94, 96 and 98 and the signals at the tap locations are transmitted to analog multipliers 100, 102, 104, 106 and 108 as illustrated in FIG. 2.

The gains of the multipliers 100, 102, 104, 106 and 108 are determinable by analog tap weight signals received on signal paths 110, 112, 114, 116 and 118 respectively, forming the bus 38 in FIG. 1, so that the responses of the multipliers 100, 102, 104, 106 and 108 are signals having amplitudes that are multiples of signals at the tap locations and the tap weights received from a microprocessor via the chip interface 12 and the equalizer tap weight DAC assembly 34. In such case, the tap weights expressed digitally in the chip interface 12 will be converted to analog signals by the transversal equalizer tap weight DAC assembly 34 of FIG. 1.

These outputs of the analog multipliers 100, 102, 104, 106 and 108 are received by an analog summing circuit 120 which provides the response of the filter 10 to the signal received from the read head (via a variable gain amplifier, not shown) on the signal path 16 of FIG. 1.

While the filter 10 as so far described provides a circuit for achieving the partial response signal wave form to be sampled in a disc drive for maximum likelihood detection, the filter 10 is comprised of additional features which are used to optimize the construction and capabilities of the filter 10. One such feature is the use of adaptive filters for the filter sections 92, 94, 96 and 98. More particularly, the present invention contemplates that the filter sections 92, 94, 96 and 98 may be constructed using operational transconductance amplifiers so that the transfer functions of the filter sections 92, 94, 96 and 98, can be adjusted in relation to currents received from the transversal equalizer delay adjust DAC assembly 42 via the analog bus 40 of FIG. 1 that has been carried into FIG. 2. As indicated by the use of a single bus, it is preferable that the filter sections 92, 94, 96 and 98 be simultaneously adjustable using a single DAC that provides signals to all of the filter sections 92, 94, 96, and 98 to limit the time required for determining the adaptive parameters used to adjust the filter 10. However, separate adjustment of the filters 92, 94, 96 and 98 can be effected without departing from the scope and spirit of the present invention. In particular, should the type of read head or choice of partial response signaling to be used in a disc drive make it advantageous to use separate adaptation of the filter sections 92, 94, 96 and 98, such separate adaptation can be readily effected utilizing the methods for selecting filter parameters. Thus, delay times provided by the filter sections 92, 94, 96, and 98 are continuously variable to enable the composite signal at the output of the summing circuit 120 to be comprised of weighted sums of signals that are delayed by whatever times will yield the closest approximation to the nominal wave form to which signals induced in the read head are to be filtered. Additionally, the adaptivity of the filter sections 92, 94, 96 and 98 eliminates any requirement for exceptional manufacturing tolerances that might otherwise be necessary for the filter 10 to accomplish the results for which it is designed.

A second feature of the filter 10 in general, and the transversal equalizer 22 in particular, is that the filter sections are low pass filters; more specifically, sixth order low pass filters. Thus, the filter sections 92, 94, 96 and 98 will contribute to the desired attenuation of high frequency components of the signal induced in the read head to minimize the requirements placed on the prefilter 14 to enable further economies in the manufacture of the filter 10.

An optional feature of the filter system 10 is the inclusion of electrical connectors in the chip interface 12 providing access to the tap locations of the transversal equalizer 22. If such feature is used, the access is provided by signal paths 130, 132, 134, 136 and 138, comprising the bus 46 in FIG. 1, that connect to the inputs of the multipliers 100, 102, 104, 106 and 108. Such feature has the advantage of expediting the determination of adaptive parameters for the filter system 10 but requires additional connections to the chip upon which the filter system 10 is formed. Accordingly, the determination of adaptive parameters for the case in which the access to the tap locations is not provided for external equipment will be discussed below in addition to the case in which access is provided.

For a more detailed explanation of GTE-type equalizers see U.S. Pat. No. 5,592,340, issued Jan. 7, 1997, entitled "Communication Channel with Adaptive Analog Transversal Equalizer" filed Sep. 21, 1994 by Minuhin et al. and U.S. Pat. No. 5,650,954, issued Jul. 22, 1997, entitled "Frequency and Time Domain Adaptive Filtration in a Sampled Communication Channel" filed Jan. 30, 1996 by Minuhin.

Figure 3:
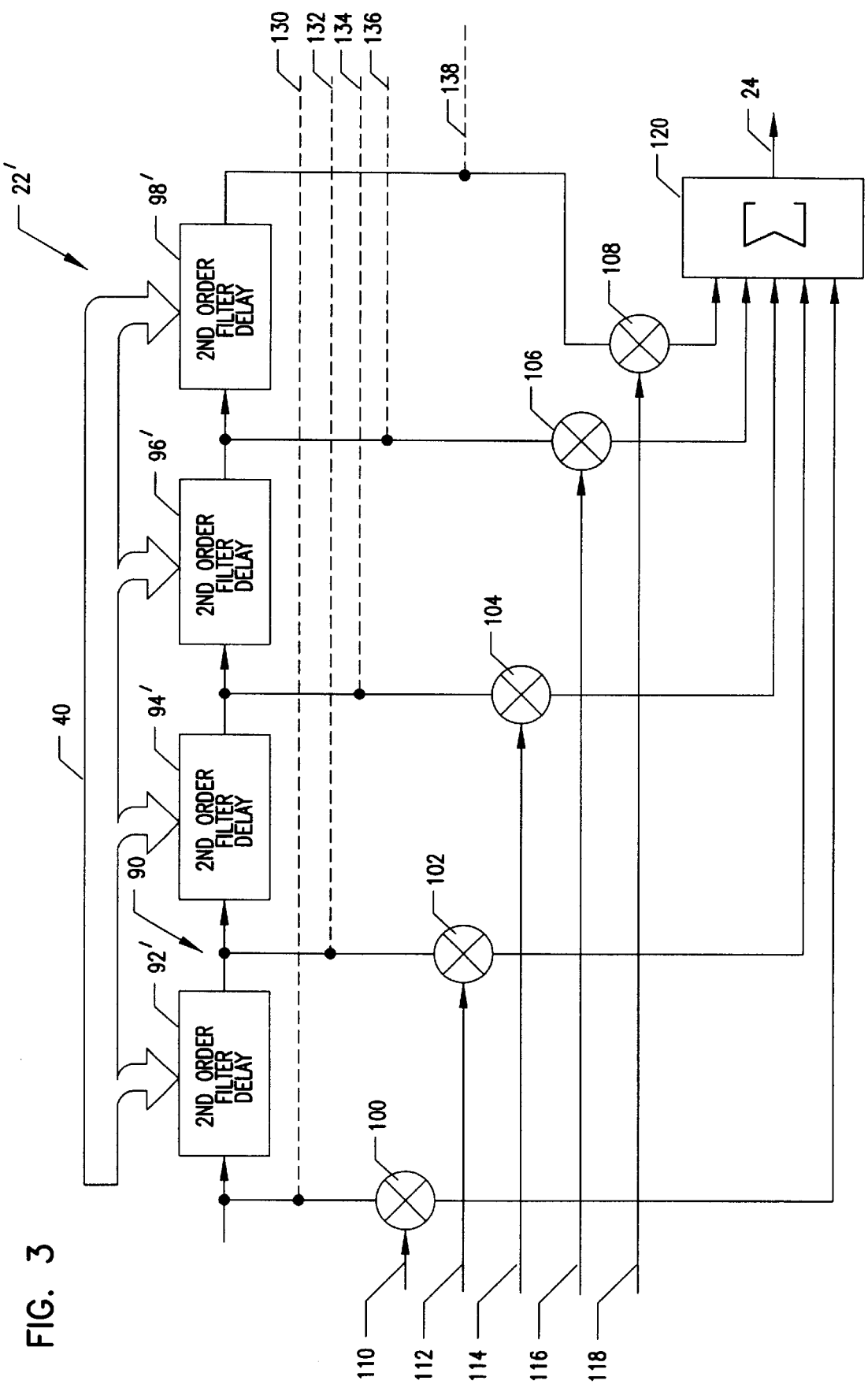
FIG. 3 is a block diagram of a GTE equalizer in accordance with a preferred embodiment of the present invention.

The present invention is directed to a filter-delay element which is employed inside of the equalizer block 22 in FIG. 1 which preferably is a GTE-type equalizer. A diagram of the GTE block of the present invention 22' is presented on FIG. 3. Comparison of FIG. 2 and FIG. 3 indicates that GTE's of the prior art and of the present invention are identical except replacement of sixth order low pass filter sections 92, 94, 96, and 98 by second order filter-delay elements 92', 94', 96', and 98' of the present invention.

Figure 4:
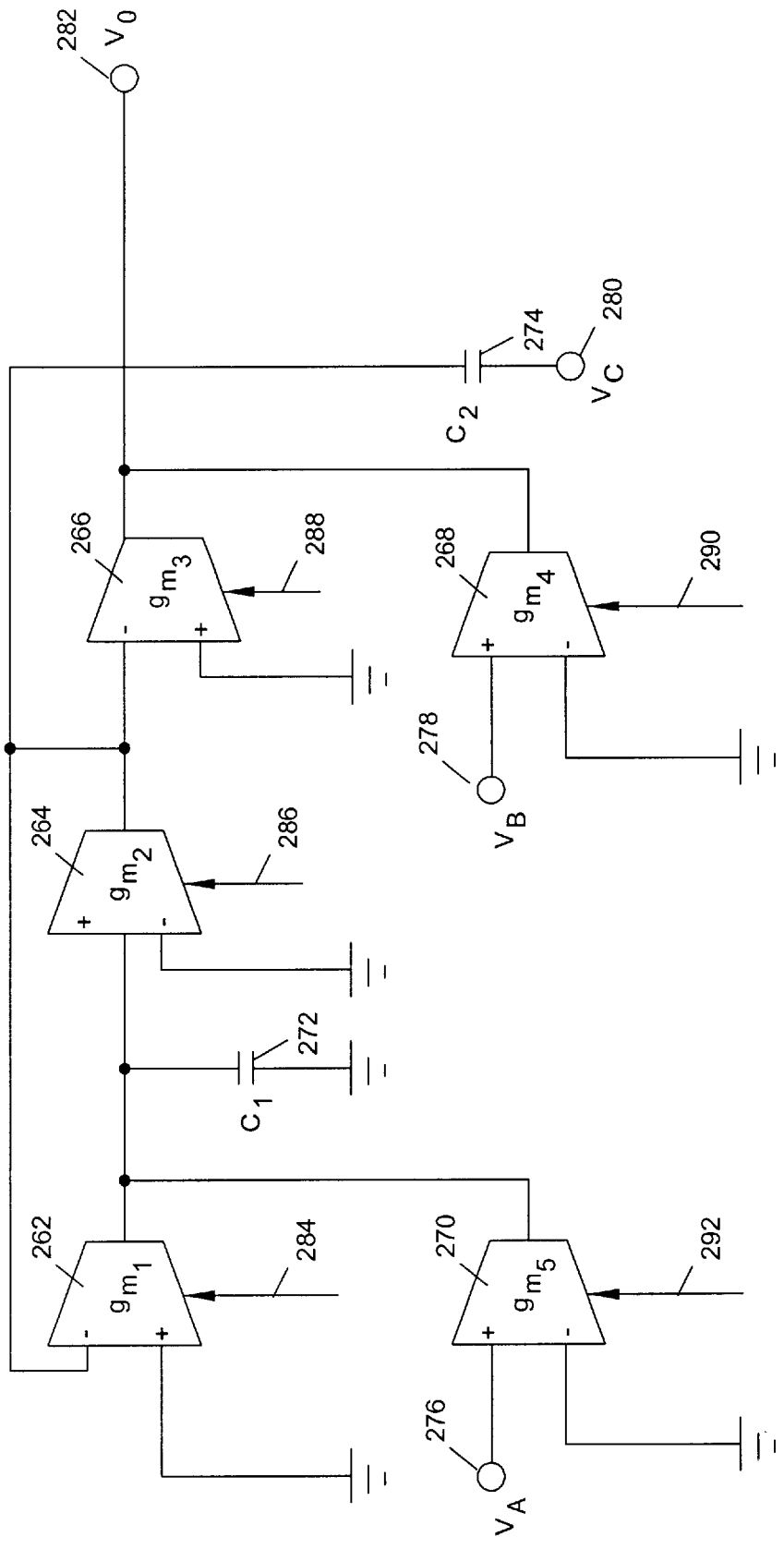
FIG. 4 is the general structure of a prior art active single biquad filter in C-transconductor realization.

FIG. 4 illustrates a general structure of an active biquad filter in C-transconductor realization. More particularly, the filter comprises five controllable transconductors 262, 264, 266, 268 and 270 (also denoted as $g_{m1}$, $g_{m2}$, $g_{m3}$, $g_{m4}$, and $g_{m5}$ respectively) and two integral capacitors 272 and 274 (also denoted as $C_1$ and $C_2$, respectively). Additionally, voltage input terminals for voltages denoted as $V_A$, $V_B$ and $V_C$ are shown at 276, 278 and 280, respectively, and the output voltage $V_0$ is shown at 282. As described in the paper by R. Geiger and E. Sanches-Sinencio "Active Filter Design Using Operational Transconductance Amplifiers: A Tutorial", IEEE Circuit and Devices magazine, vol.1, No.2, March 1985, pp.20–32, the transfer function (Eq. 1) of the filter is given as:

$$V_0 = \frac{s^2 C_1 C_2 V_C + s C_1 g_{m4} V_B + g_{m2} g_{m5} V_A}{s^2 C_1 C_2 + s C_1 g_{m3} + g_{m1} g_{m2}} \quad \text{(Eq. 1)}$$

with $C_1$ and $C_2$ being the capacitance values of capacitors 272 and 274, $g_{m1}$, $g_{m2}$, $g_{m3}$, $g_{m4}$, and $g_{m5}$ being the transconductance values of transconductors 262, 264, 266, 268 and 270, respectively (which are controlled by the bias current provided on signal paths 284, 286, 288, 290 and 292, respectively).

From this basic structure, the transfer functions and building blocks necessary to realize all versions of the transfer function may be derived. It will be recognized, of course, that other types of building blocks may be utilized in achieving the transfer function.

A structure of active biquad of FIG. 4 facilitates independent controls of all its poles and zeros, but is complex in realization. It requires 2 integral capacitors and 5 transconductors, at least 2 buffers, and, in addition, an elaborate individual control of currents that bias transconductors.

Figure 5:
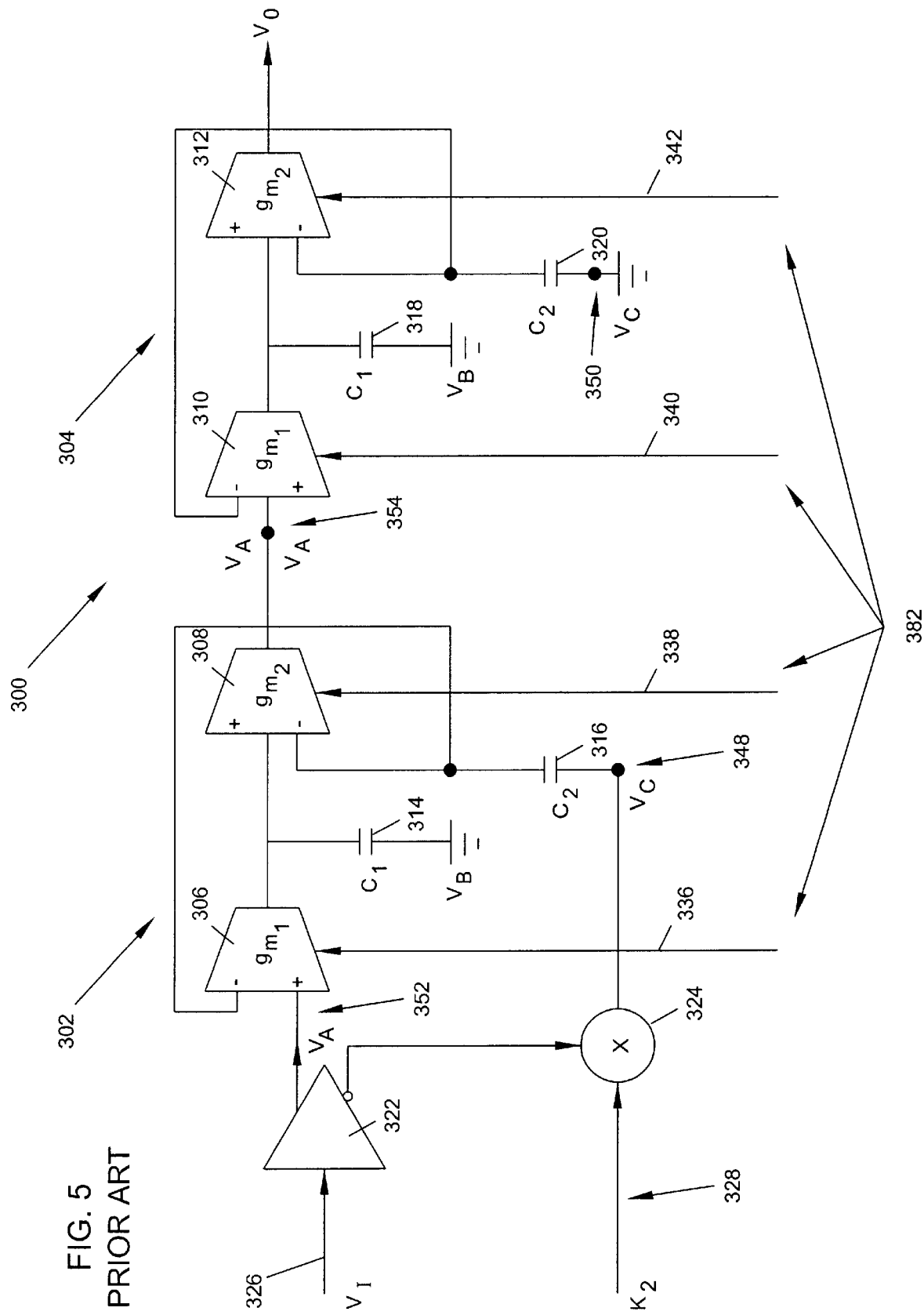
FIG. 5 is a schematic block diagram of a prior art filter-delay section of an equalizer.

FIG. 5 is the schematic block diagram of a practical prior art filter-delay element for GTE equalizer used in an integrated read channel for digital magnetic recording. Briefly, the circuit is the linear-phase low-pass filter with a high frequency boost in the passband, which is achieved by using forward signal path 348 from the inverted output of buffer 322 to $C_2$ capacitor 316. For further details see U.S. Pat. No. 5,650,954, issued Jul. 22, 1997, entitled "Frequency and Time Domain Adaptive Filtration in a Sampled Communication Channel" filed Jan. 30, 1996 by Minuhin. Alternatively, substantially similar details are described in a paper by K. Parsi et al "A PRML Read/Write Channel IC Using Analog Signal Processing for 200 Mb/s HDD", IEEE Journal of Solid-State Circuits, vol.31, No.11, November 1996, pp.1817–1830).

The filter-delay element of FIG. 5 possesses near ideal frequency-domain responses in the passband. The responses are shown in normalized (to 1 bit/sec transfer rate in the channel) form in FIGS. 6 and 7. This filter-delay element consists of two biquads 302 and 304 in series connection and for its realization requires 4 integral capacitors 314, 316, 318 and 320, 4 transconductors 306, 308, 310, 312 and a buffer 322.

Figure 6:
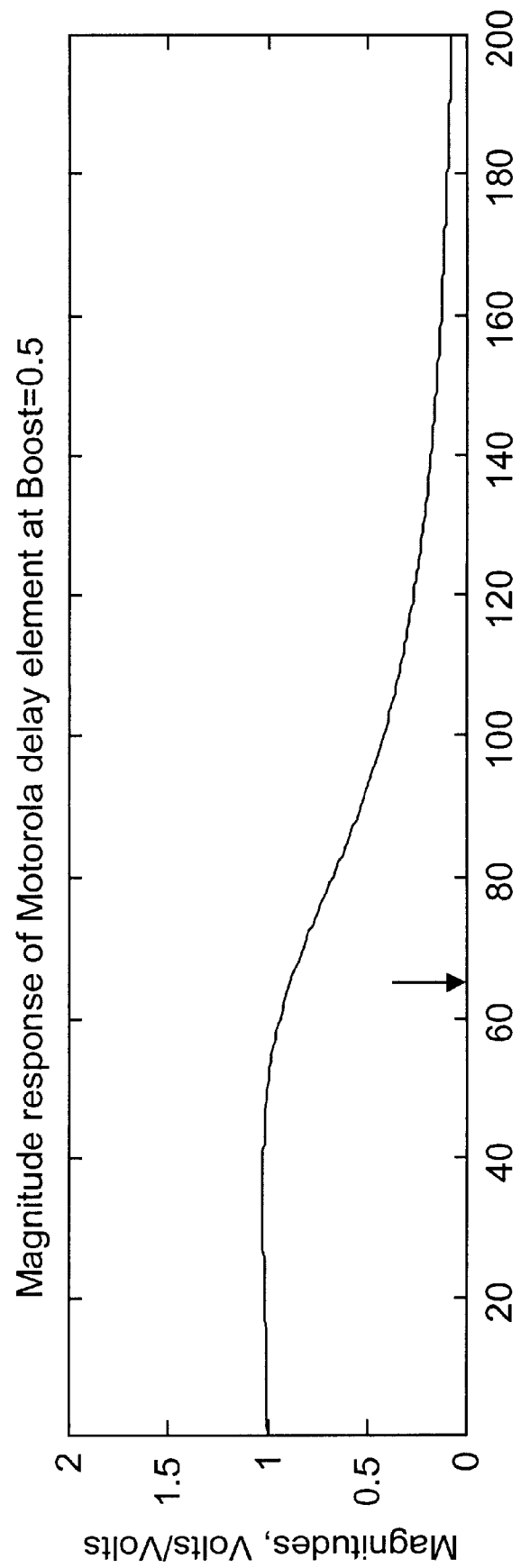
FIGS. 6 and 7 are frequency-domain responses of the prior art filter-delay sections shown in FIG. 5.
Figure 7:
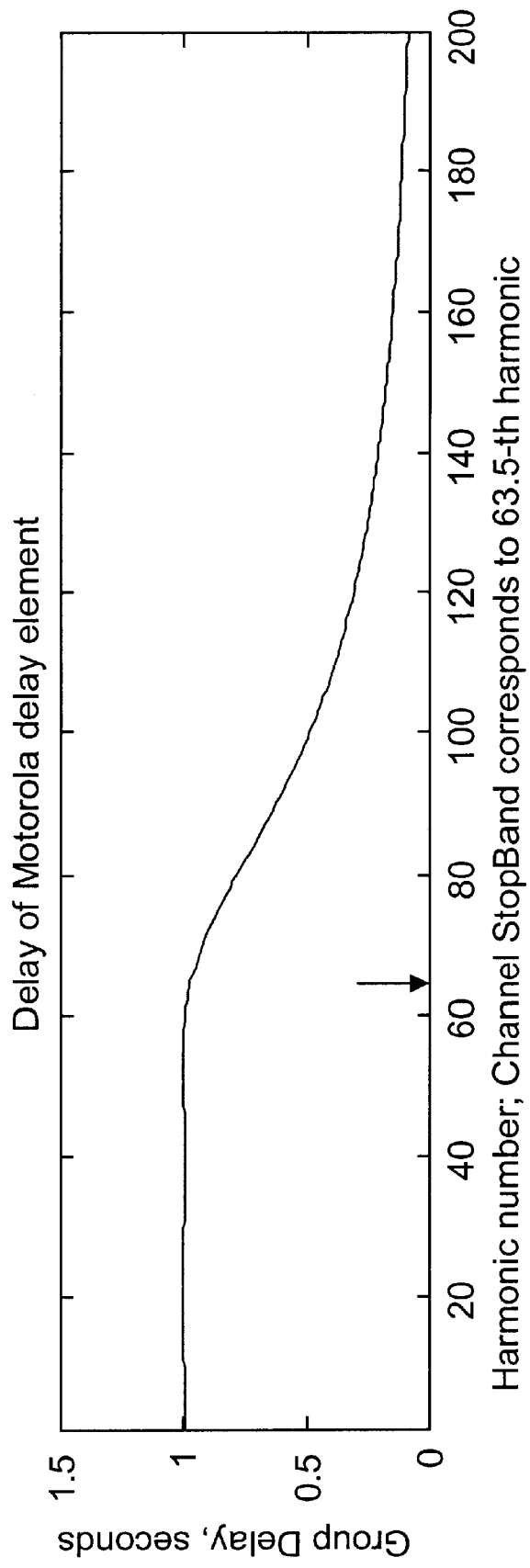

A GTE-type equalizer is very forgiving for imperfections of transfer functions used in filter-delay elements. This is because effects of all possible imperfections (unless they are extremely severe) are compensated at the GTE output by automatic (adaptive) modifications of tap weight values (numerals 110 through 118 in FIG. 3). Actually, near perfect frequency responses of filter-delay sections of the prior art as illustrated by FIGS. 6 and 7 are not necessary in practice. The presence of moderate phase and delay distortions in filter-delays can be tolerated. After all, the GTE equalizer is also a phase corrector and by the nature of negative feedback in the tap weight adaptation loop, it can correct phase and time distortions inside of itself.

Thus, even though ideal transfer function for the filter-delay element of the GTE equalizer should be the transfer function with a uniform group delay (that is equal to duration of one symbol period), in reality, provided that phase distortions are not severe, it is sufficient to have a weighted average group delay of filter-delay element in channel passband that is equal to the symbol period. Examples of transfer functions that have such feature are the transfer functions of linear-phase low-pass filters. To simplify practical circuits, the present invention uses transfer functions of these filters as prototypes. The described below method and procedure allow rearrangement of transfer functions of low-pass filters of third and fourth orders to obtain transfer functions of second orders for real filter-delays elements of the GTE. These second order functions provide the same phase/delay responses as responses of original higher order filter-prototypes. After the rearrangement of transfer functions, the corresponding second-order filters are realized in an active implementation.

The following is the step-by-step explanation of method and procedure for syntheses and practical realization of filter-delays elements of second order for the GTE. For the sake of maximal clarity, an example of a third order low-pass prototype illustrates the procedure.

1. Start with some prototype polynomial (preferable linear phase polynomial) for normalized (to 3-dB down at ω=1) transfer functions of low-pass filters of thrid or fourth orders. For example, one may choose as a prototype a third order low-pass filter with transfer function shown in (Eq. 2) as:

$$T(s) = \frac{r}{s^3 + ps^2 + qs + r}, \quad \text{(Eq. 2)}$$

where p, q, r are coefficients of the polynomial chosen and s is a complex frequency.

2. Decompose the polynomial into two real multiplicands. Then, the transfer function of prototype low pass filter chosen can be represented as (Eq. 3) as follows:

$$T(s) = \frac{b_2 a_1}{(s^2 + a_2 s + b_2)(s + a_1)}, \quad \text{(Eq. 3)}$$

where a and b are resulting coefficients with the subscripts indicating factor order. Note that the numerator will be product of terms with zero degrees of s in polynomial factors.

3. Move one multiplicand from denominator into numerator. By doing so the transformation of poles (provided by moved multiplicand) into corresponding zeros of transfer function is achieved. The conceptual transfer function will be represented as (Eq. 4) which is:

$$T(s) = \frac{s + a_1}{(s^2 + a_2 s + b_2)}. \quad \text{(Eq. 4)}$$

4. Change the sign before members with odd degree of s in the numerator which results in the conceptual transfer function represented as (Eq. 5) which is:

$$T(s) = \frac{-s + a_1}{(s^2 + a_2 s + b_2)}, \quad \text{(Eq. 5)}$$

Approximated transfer function (Eq. 5) has the same phase and group delay responses as an original low-pass filter (Eqs. 2 and 3), but some variation of magnitude response in the passband of it (see FIG. 11 later). As mentioned above, the GTE equalizer tolerates these variations very well.

As can be readily understood, the function (Eq. 5) solves the problem of approximation of the desired transfer function of the second order filter-delay element.

Figure 8:
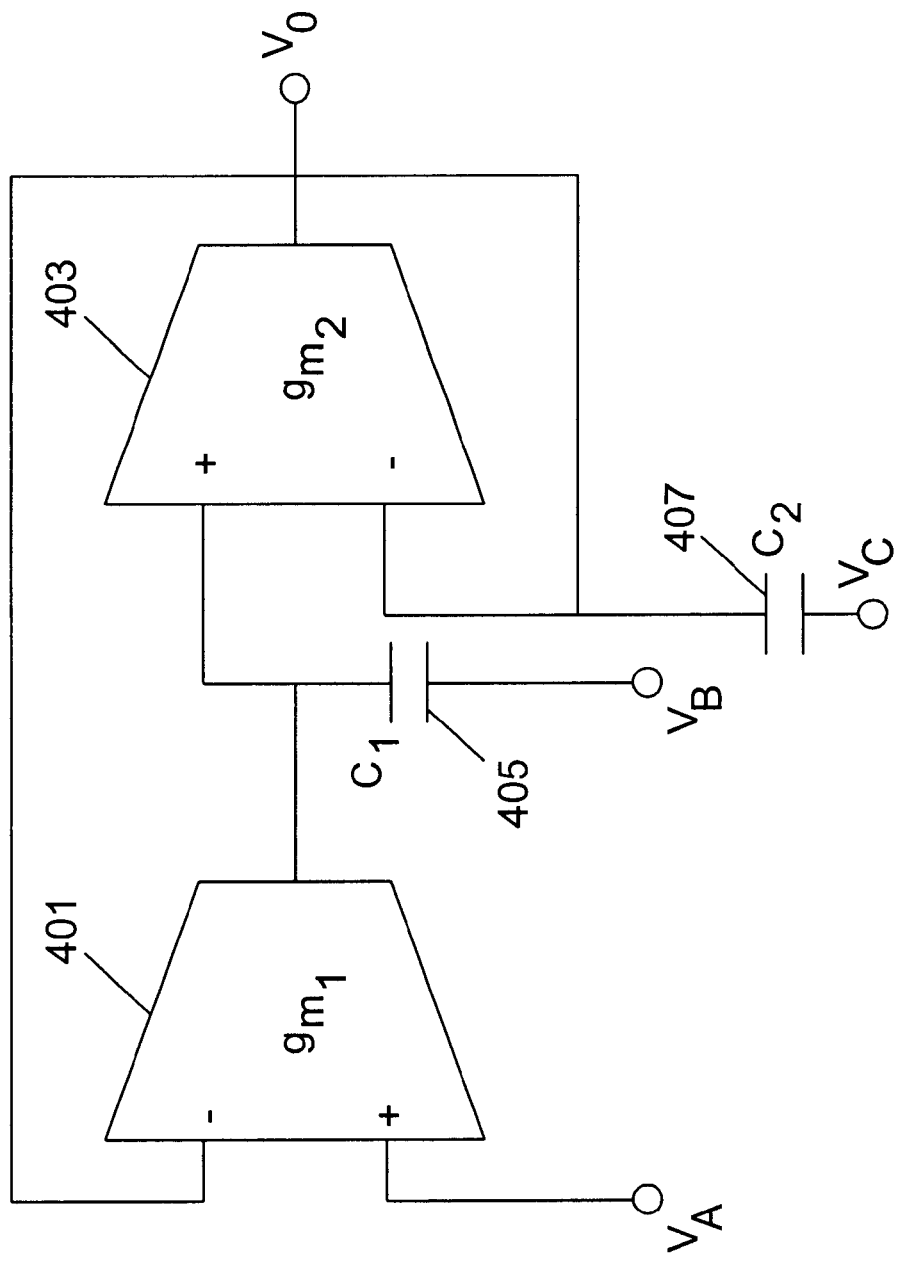
FIG. 8 is a block diagram of a simple canonical C-transconductor realization of a prior art second order filter-delay element.

A canonical simple biquad structure with the output voltage $V_O$ is described in the previously mentioned paper by Geiger and replicated for ease of discussion in FIG. 8. In addition, transfer functions for the specific excitations at nodes $V_A$, $V_B$ and $V_C$ shown in FIG. 8 are given in Table 1.

TABLE 1

| Circuit Type | Input Conditions | Transfer Function | If $g_{m1} = g_{m2} = g_m$ | |
|---|---|---|---|---|
| | | | $\omega_0$ | Q |
| $\omega_0$ Adjustable Lowpass | $V_i = V_A$ $V_B$ and $V_C$ Grounded | $\frac{g_{m1} g_{m2}}{s^2 C_1 C_2 + s C_1 g_{m2} + g_{m1} g_{m2}}$ | $\frac{g_m}{\sqrt{C_1 C_2}}$ | $\sqrt{\frac{C_1}{C_2}}$ |
| $\omega_0$ Adjustable Bandpass | $V_i = V_B$ $V_A$ and $V_C$ Grounded | $\frac{s C_1 g_{m2}}{s^2 C_1 C_2 + s C_1 g_{m2} + g_{m1} g_{m2}}$ | $\frac{g_m}{\sqrt{C_1 C_2}}$ | $\sqrt{\frac{C_1}{C_2}}$ |
| $\omega_0$ Adjustable Highpass | $V_i = V_C$ $V_A$ and $V_B$ Grounded | $\frac{s^2 C_1 C_2}{s^2 C_1 C_2 + s C_1 g_{m2} + g_{m1} g_{m2}}$ | $\frac{g_m}{\sqrt{C_1 C_2}}$ | $\sqrt{\frac{C_1}{C_2}}$ |
| $\omega_0$ Adjustable Notch | $V_i = V_A = V_C$ $V_B$ Grounded | $\frac{s^2 C_1 C_2 + g_{m1} g_{m2}}{s^2 C_1 C_2 + s C_1 g_{m2} + g_{m1} g_{m2}}$ | $\frac{g_m}{\sqrt{C_1 C_2}}$ | $\sqrt{\frac{C_1}{C_2}}$ |

If identical transconductors 401 and 403 are employed ($g_{m1}=g_{m2}=g$), then the output voltage $V_o$ is given as:

$$V_0 = \frac{s^2 V_C + s(g/C_1)V_B + (g^2/(C_1 C_2))V_A}{s^2 + s(g/C_1) + g^2/(C_1 C_2)}, \quad \text{(Eq. 6)}$$

If capacitor $C_2$ is grounded and $V_B = -V_A$, then the transfer function is:

$$T(s) = \frac{V_0}{V_A} = \frac{-(g/C_1)s + g^2/(C_1 C_2)}{s^2 + s(g/C_1) + g^2/(C_1 C_2)} = \frac{-a_2 s + b_2}{s^2 + a_2 s + b_2}, \quad \text{(Eq. 7)}$$

where $b_2 = g^2/(C_1 C_2) = \omega_o^2$, $\omega_o$ is a natural frequency of the second order filter, $a_2 = g/C_1 = \omega_o/Q$, $Q$ is a pole quality factor, $\omega_0 = g/\sqrt{C_1 C_2}$, and $$Q = \sqrt{\frac{C_1}{C_2}}.$$

Note that coefficients of the numerator in (Eq. 7) $a_2$ and $b_2$ are those determined by the denominator and therefore, not those desired. As indicated above in the approximation steps, it is desired to realize a transfer function with specific zeros, that, in conjunction with denominator, provide desirable phase/delay response of the prototype low-pass filter as given by (Eq. 5).

According to (Eq. 6) and (Eq. 7), this goal can be achieved if a value of excitation voltage at node $V_B$ is chosen equal to:

$$V_B = -\frac{b_2}{a_1 a_2} V_A. \quad \text{(Eq. 8)}$$

Then, $$V_0 = \frac{-a_2 s * (b_2(a_1 a_2))V_A + b^2 V_A}{s^2 + a_2 s + b_2}, \quad \text{(Eq. 9)}$$

and the transfer function equals:

$$T(s) = \frac{V_0}{V_A} = \frac{-(b_2/a_1)s + b_2}{s^2 + a_2 s + b_2} = \frac{b_2(-s/a_1 + 1)}{s^2 + a_2 s + b_2}, \quad \text{(Eq. 10)}$$

results.

It is easy to see that the realizable transfer function (Eq. 10) has the same distribution of poles and zeros as the desirable transfer function (Eq. 5), and, in addition, it has unit gain at DC.

Figure 9:
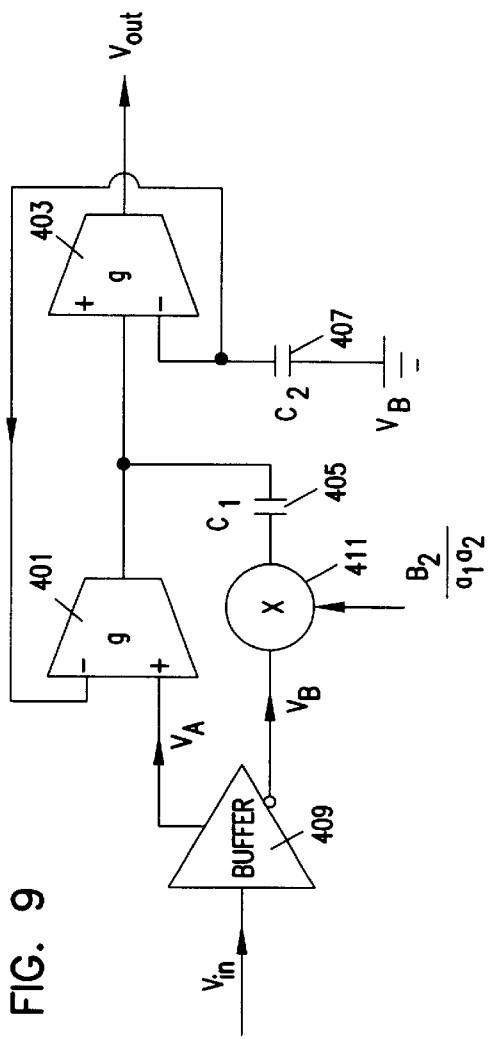
FIGS. 9 and 10 are schematic block-diagrams of two versions of C-transconductor realizations of second order filter-delay elements in accordance with preferred embodiments of the present invention.

The practical structure for the single-biquad C-Transconductor realization of the filter-delay element for GTE equalizer emerges from the derivations above. It is illustrated by FIG. 9. The circuit comprises of two transconductors g, numerals 401, 402, two integral capacitors $C_1$, $C_2$, numerals 405, 407, buffer 409 with complimentary outputs and a fixed multiplier 411 with coefficient of multiplication given by (Eq. 8).

Figure 10:
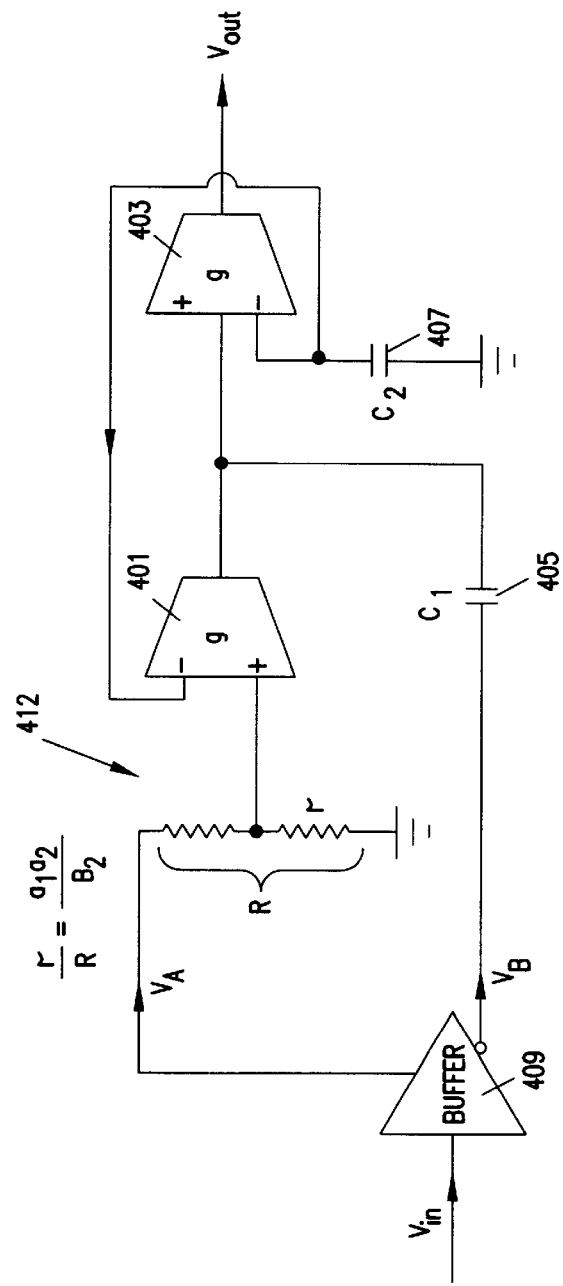

An alternative realization which employs a simple resistive attenuator 412, instead of multiplier (of FIG. 9) is shown in FIG. 10. The coefficient of attenuation r/R is reciprocal of that in (Eq. 8):

$$\frac{r}{R} = \frac{a_1 a_2}{b_2} \quad \text{(Eq. 11)}$$

With the formulae (Eq. 8) through (Eq. 11), the problem of realization of second order filter-delay elements has been solved except for any necessary frequency scaling. Generally, a value of delay in synthesized circuits will be inversely proportional to the frequency scaling coefficient chosen. However, as mentioned, in all derivations above the frequency scale normalization of the polynomials (and the corresponding filters) was with respect to 3-db down frequency $\omega=1$ for the prototype low-pass filters. As a rule, this normalization will not provide correct value of delay for synthesized delay elements. This is because main function of synthesized circuits is to provide proper value of delay (one channel symbol interval in the time domain), as oppose to low-pass filtering in prototypes. The coefficient for proper frequency scaling can be found experimentally by simulation of GTE equalization or by measurements in actual hardware. As mentioned above, the GTE equalizer actually "sees" a weighted average value of delay in the passband, and exact weighting coefficients depend on frequency content of signals passing through the GTE, (which, in turn, depend on input signals, prefilter used and parameters of filter-delays themselves). In the process of simulation of GTE equalization, an implicit determination of these weighting coefficients occur. The correct frequency scaling coefficient must be such that it provides one-bit delay in time domain between tap signals at successive taps of the GTE equalizer. Usually several iterations in simulation will be practically needed to find correct coefficient of frequency scaling.

Figure 11:
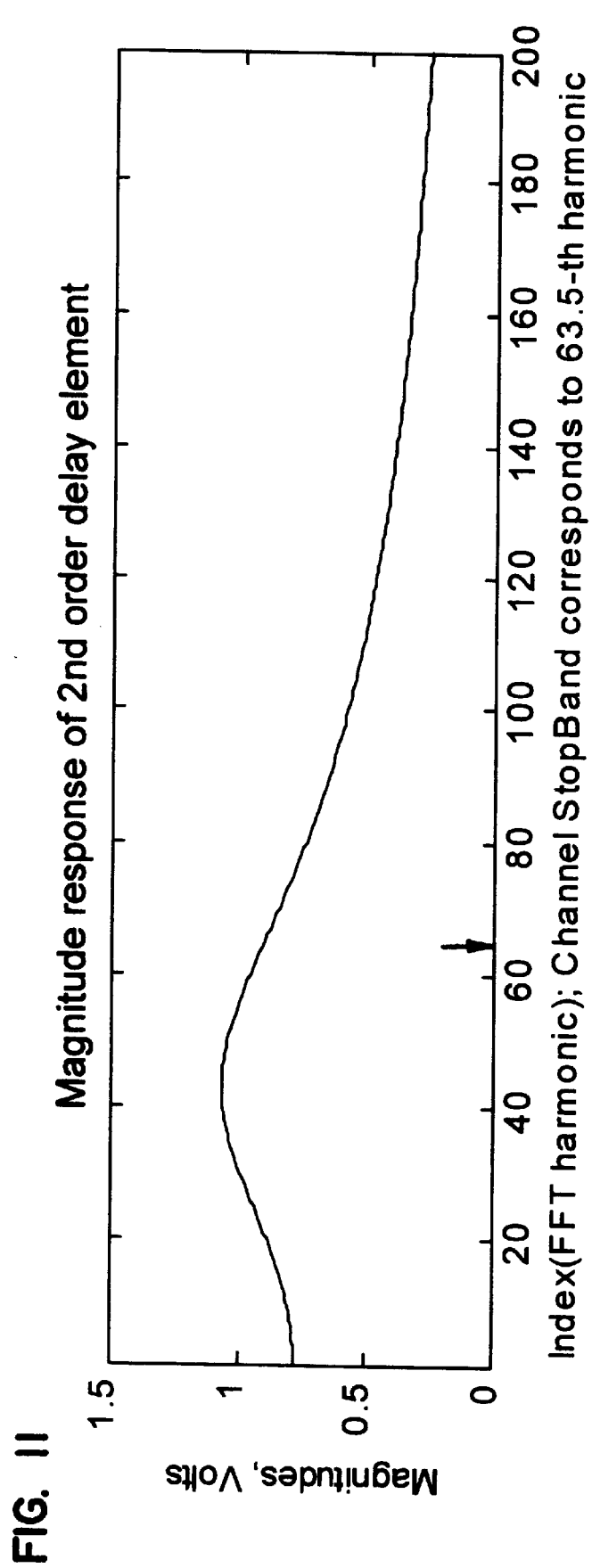
FIGS. 11 and 12 are frequency-domain responses of the second order filter-delay elements shown in FIGS. 9 and 10.
Figure 12:
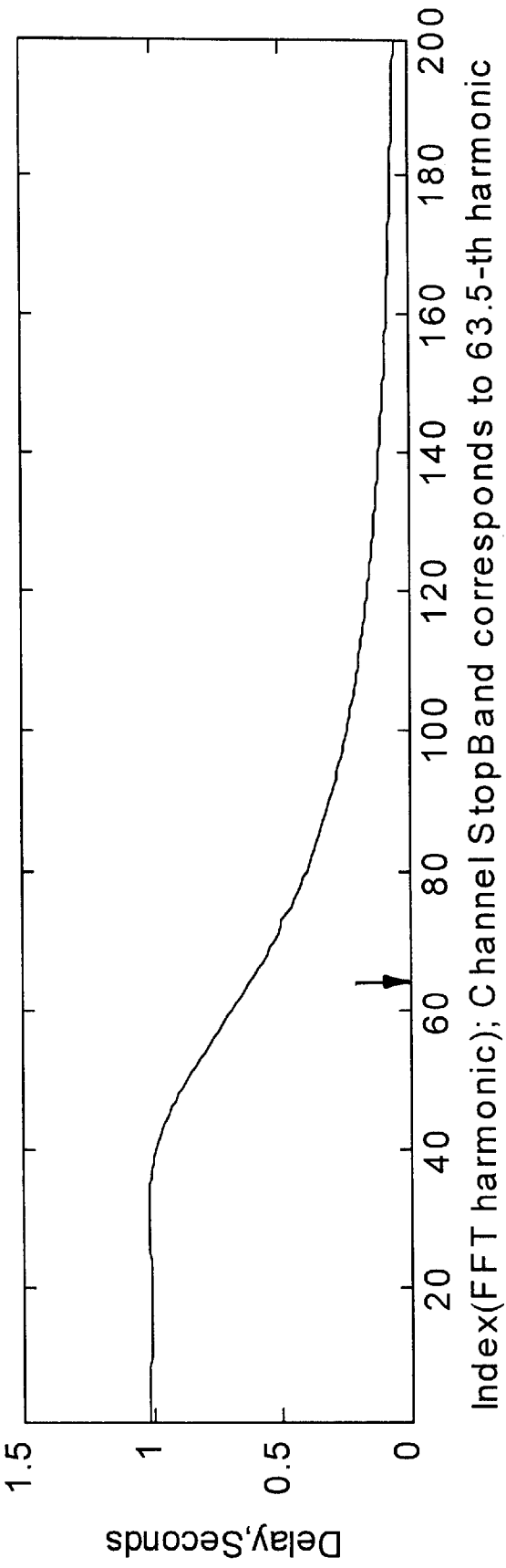

FIGS. 11 and 12 illustrate obtained in practice responses (normalized to 1 bit/sec transfer rate in the channel) of the second-order filter-delay element for the GTE equalizer synthesized according to the described technique. The third order equiripple (i.e., ripple 0.050) linear phase low-pass filter polynomial normalized to 3-dB down at $\omega=1$ was used as a prototype (see D. Humpherys, "Equiripple Network Approximations Using Iterative Techniques", Proceedings of National Electron. Conference, vol.20, pp. 753–758, 1964).

After simulation of the GTE equalization with synthesized filter-delays it was found that a good frequency scaling coefficient is 1.84. As evident from FIGS. 11 and 12, actual group delay of the synthesized delay element is flat in ~2/3 of passband and then it decreases with a gradual rolloff. The value of group delay at direct current (DC) and in the flat region is slightly more than the desired value in the time domain −1 second. This is what it actually should be, because, as mentioned above the GTE equalizer "sees" an average value of delay in the passband and slightly larger delay in the flat region is necessary to compensate decrease of group delay at high frequencies.

The whole process of adaptive GTE equalization with the synthesized second order delay-elements has been simulated and the results of simulation were compared with those for the GTE equalization with fourth order filter-delay elements that have almost ideal responses illustrated by FIGS. 5–7 (as mentioned, these filter-delay elements require twice as much hardware, space and power dissipation as those described in a present application). Practically identical performances of two equalizations have been achieved with a slightly more frequency boost in prefilter 14 in FIG. 1) for the GTE with second order delay elements.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. A second order filter-delay element for use in a generalized analog transversal equalizer comprising filter-delay means for providing phase and group delay responses equivalent to low-pass filters of third and fourth order and providing sufficient values of delays required for proper operations of the analog generalized transversal equalizer despite having a low order.

2. The filter-delay element of claim 1 wherein the filter-delay means is realized as active devices in monolithic integrated circuits.

3. The filter-delay element of claim 2 wherein at least a portion of the filter-delay means is realized as monolithic C-transconductor integral circuit.

4. A method of generating a lower order filter-delay element for use in a generalized analog transversal equalizer by transforming transfer functions of low-pass filters of third and fourth orders into integrated circuit realizable transfer functions with equivalent phase and group delay responses of second-order despite being a lower order transfer function, the method comprising steps of:

(a) decomposing denominators of an original low-pass transfer function into two polynomial multiplicands;

(b) moving one polynomial multiplicand from a denominator into a numerator;

(c) changing sign of members with odd degree of complex frequencies in the numerator;

(d) adjusting coefficients of polynomial in the numerator to achieve zeros of transformed transfer function that are mirror-reflected images relative to complex frequency axis of poles created by the moved polynomial multiplicand in the original low-pass transfer function;

(e) generating a lower order filter-delay element based on the transformed transfer function.

5. A circuit embodying an active C-transconductor realization of a second order filter-delay element for use in a generalized analog transversal equalizer with a transfer function designed as a result of performing the method of claim 4, the circuit comprising:

(a) a biquad C-transconductor circuit with at least two excitation nodes;

(b) an input voltage buffer with two complimentary outputs; and (c) adjustment means for changing a ratio of two signals provided by the two complimentary outputs at input excitation nodes of the C-transconductor circuit to obtain required coefficients of a numerator of a transfer function to realize desired zeros of the transformed transfer function.

6. The circuit of claim 5 wherein the adjustment means comprises a fixed multiplier in one signal path within the circuit with a control multiplying input providing proper coefficient of multiplication to obtain required coefficients of the numerator of the transfer function which realizes desired zeros of the transformed transfer function.

7. The circuit of claim 5 wherein the adjustment means comprises an attenuator in one signal path within the circuit with a proper coefficient of attenuation to obtain required coefficients of the numerator of the transfer function which realizes desired zeros of the transformed transfer function.

* * * * *